United States Patent

Beckenbaugh et al.

(10) Patent No.: US 7,698,681 B2
(45) Date of Patent: *Apr. 13, 2010

(54) METHOD FOR RADIATION TOLERANCE BY LOGIC BOOK FOLDING

(75) Inventors: Mark R. Beckenbaugh, Rochester, MN (US); AJ KleinOsowski, Austin, TX (US); Eric J. Lukes, Stewartville, MN (US); Byron D. Scott, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 216 days.

This patent is subject to a terminal disclaimer.

(21) Appl. No.: 11/838,273

(22) Filed: Aug. 14, 2007

(65) Prior Publication Data

US 2009/0045840 A1 Feb. 19, 2009

(51) Int. Cl.
G06F 17/50 (2006.01)
H03K 19/00 (2006.01)
H03K 19/177 (2006.01)
H01L 27/088 (2006.01)

(52) U.S. Cl. .................. 716/17; 716/10; 326/45; 257/371; 257/E27.067

(58) Field of Classification Search ............ None
See application file for complete search history.

(56) References Cited

U.S. PATENT DOCUMENTS

| | | | |
|---|---|---|---|
| 4,745,084 A * | 5/1988 | Rowson et al. ............... 438/129 |
| 5,220,192 A | 6/1993 | Owens et al. |
| 6,100,550 A | 8/2000 | Hidaka |
| 6,177,691 B1 * | 1/2001 | Iranmanesh et al. ......... 257/211 |
| 6,177,709 B1 * | 1/2001 | Iranmanesh .................. 257/390 |
| 6,212,671 B1 * | 4/2001 | Kanehira et al. .............. 716/19 |
| 6,292,343 B1 | 9/2001 | Pequignot et al. |
| 6,583,470 B1 * | 6/2003 | Maki et al. ................... 257/349 |
| 6,735,755 B2 * | 5/2004 | Shau ............................ 716/16 |
| 2009/0045841 A1 * | 2/2009 | Beckenbaugh et al. ........ 326/45 |

* cited by examiner

*Primary Examiner*—Leigh Marie Garbowski
(74) *Attorney, Agent, or Firm*—Libby Z. Handelsman; Jack V. Musgrove

(57) ABSTRACT

A logic book for a programmable device such as an application-specific integrated circuit (ASIC) achieves improved radiation tolerance by providing transistors of the same doping type in different well regions that are physically isolated by intervening well regions with complementary doping. For example, n-type field effect transistors (NFETs) may be located in two outer rows of the book with separate Pwell regions, while p-type transistors are located in two inner rows of the book sharing a common Nwell region. Since the NFETs in separate wells are physically isolated from each other, a circuit structure which uses two NFETs in the two outer rows is much less likely to suffer multiple upsets from a single radiation strike. More complicated embodiments of the present invention include additional transistor rows in the stack with isolated Nwells and Pwells.

10 Claims, 4 Drawing Sheets

METHOD FOR RADIATION TOLERANCE BY LOGIC BOOK FOLDING

CROSS-REFERENCE TO RELATED APPLICATION

This application is related to U.S. patent application Ser. No. 11/838,286 filed Aug. 14, 2007, which is hereby incorporated.

BACKGROUND OF THE INVENTION

1. Field of the Invention

The present invention generally relates to the fabrication and design of semiconductor chips and integrated circuits, and more particularly to a method of imparting radiation tolerance to a programmable logic device such as an application-specific integrated circuit (ASIC) having a design library which includes books of n-type and p-type semiconductor devices.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of a circuit into a layout is called the physical design.

Due to the large number of components and the details required by the fabrication process, physical design of an integrated circuit is not practical without the aid of computers. As a result, most phases of physical design extensively use computer aided design (CAD) tools, and many phases have already been partially or fully automated. Automation of the physical design process has increased the level of integration, reduced turn around time and enhanced chip performance. However, full custom design and production of a circuit can still be very time-consuming and costly, so circuit designers have turned to a more flexible approach using programmable logic devices such as field programmable gate arrays (FPGAs) or application-specific integrated circuits (ASICs) that contain standardized logic cells. One example of an ASIC is shown in FIG. 1. ASIC 2 has a plurality of input pins and a plurality of output pins, and further includes a variety of interconnected functional blocks placed on a substrate that are derived from the design library, including input/output (I/O) blocks, a core or microprocessor, an arithmetic logic unit (ALU), a digital signal processor (DSP), random-access memory (RAM), firmware or read-only storage (ROS), proprietary circuit macros (IP), and programmable logic. The programmable logic may be provided in the form of books 4 which contain rows of various semiconductor devices such as transistors and diodes, or other circuit elements such as capacitors and resistors, and can be used to create combinational gates such as AND, OR, NAND, NOR, and XOR gates as well as inverters, latches and more complicated logic structures.

FIGS. 2A and 2B illustrate two typical constructions for transistor books. The transistor book 4$a$ of FIG. 2A has a first (upper) row of p-type field effect transistors (PFETs) located within a region of complementary (n-type) doping 6 referred to as an Nwell, and a second (lower) row of n-type field effect transistors (NFETs) located within a region of complementary (p-type) doping 8 referred to as an Pwell. The transistor book 4$b$ of FIG. 2B is similar but the NFETs in Pwell 8 are located in the upper row and the PFETs in Nwell 6 are located in the lower row. Nwell 6 and Pwell 8 may extend vertically beyond the boundary of book 2$a$ or book 2$b$ into adjacent books. In this example the individual transistors have a width of about 1 μm, so the overall width of book 4$a$ is around N μm where N is the number of transistors in a row (e.g., 28). The logic is programmed by applying a metallization layer that makes appropriate interconnections with the nodes of desired devices in the books.

One problem with this book construction is that, since each PFET shares the common Nwell 6 and each NFET shares the common Pwell 8, a radiation strike in either of these wells can affect multiple devices in that row, increasing the likelihood of a soft error. For example, one NFET device may be used in a latch to hold a true value of a bit and another NFET device in the same book may be used to hold the complementary (inverse) value of the bit, and a single radiation event can lead to upset both NFET devices, causing the latch to change its logical state. The radiation may be, e.g., an alpha particle strike emitted from packaging materials or neutrons originating from cosmic radiation. The soft-error rate (SER) of a data processing system can exceed the combined failure rate of all hard-reliability mechanisms (gate oxide breakdown, electromigration, etc.). Radiation tolerance has thus become a necessity for meeting robustness targets in advanced systems. All storage elements (random-access memory, latches, etc.) are highly susceptible to soft-error induced failures, but memory arrays are usually protected by error-correction codes (ECCs) while latches are usually not so protected. Soft errors in latches are accordingly the major contributors to overall system SER.

Information stored in latches may include control, status or mode bits. For example, a data processing system might provide different mode configurations for clock control logic, and clock control latches can account for a significant portion of a microprocessor latch count. These clock buffer modes are set at system power-on and often must maintain their logical value for days or months to ensure proper performance of the local logic circuits. However, the values can be upset during operation due to soft errors. An upset may be correctable by scanning in a new value, but systems may only allow input scanning in a limited manner such as at power-on, meaning that the system must be restarted if a clock control latch becomes incorrectly set. These reliability problems are particularly troublesome for harsher operating environments, such as aerospace systems where there is increased radiation (high-altitude or orbital space).

For transistor book constructions such as those shown in FIGS. 2A and 2B, it is difficult to ensure critical node separation between like devices for radiation tolerance. In very long books the designer can select devices that are at opposite ends of a row but such wide spacings can lead to ASIC methodology violations. Consequently, the only effective way to achieve superior radiation tolerance is by full custom placement, i.e., breaking up logic books into individual gates, which significantly increases the time and cost for design and production of the circuit. It would, therefore, be desirable to devise an improved ASIC book design which could provide the advantages associated with programmable structures but offer better isolation of localized semiconductor devices that might otherwise be affected by a radiation strike. It would be further advantageous if the book design could be implemented in a variety of relative sizes and work within existing ASIC methodologies.

SUMMARY OF THE INVENTION

It is therefore one object of the present invention to provide an improved logic structure for a programmable device such as an ASIC.

It is another object of the present invention to provide such a logic structure having increased radiation tolerance.

It is yet another object of the present invention to provide a method of using an ASIC transistor book to enhance radiation tolerance.

The foregoing objects are achieved in a logic book for an ASIC, generally comprising one or more contiguous rows of first semiconductor devices having a first doping type located within a first complementary well region, and two or more rows of second semiconductor devices having a second doping type located within respective second complementary well regions, wherein said rows of said first semiconductor devices and said rows of said second semiconductor devices are parallel and at least two of said second complementary well regions are physically isolated by said first complementary well region. The logic book may be a transistor book wherein the first semiconductor devices are transistors having the first doping type and the second semiconductor devices are transistors having the second doping type. In one embodiment, the first complementary well region is a Pwell, the first semiconductor devices are n-type devices in two contiguous rows sharing the Pwell, the second complementary well regions are separate Nwells, and the second semiconductor devices are p-type devices. In an alternative embodiment the first complementary well region is an Nwell, the first semiconductor devices are p-type devices in two contiguous rows sharing the Nwell, the second complementary well regions are separate Pwells, and the second semiconductor devices are n-type devices. Since the transistors in separate wells are physically isolated from each other, the circuit structure is much less likely to suffer multiple upsets from a single radiation strike. More complicated embodiments of the present invention include additional transistor rows in the stack with isolated Nwells and Pwells.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2A:
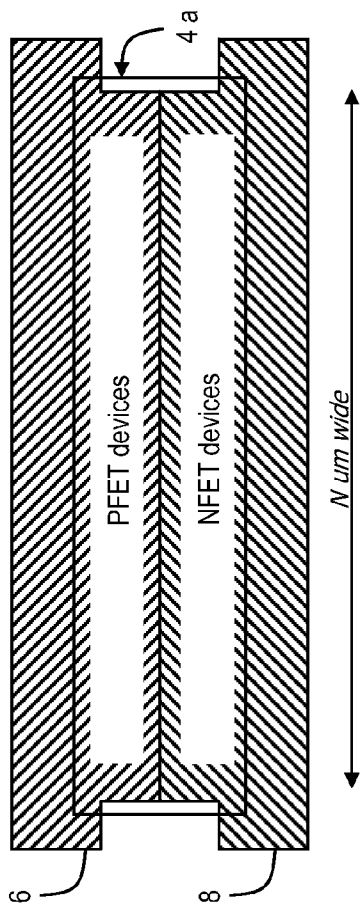
FIGS. 2A and 2B are plan views of two conventional ASIC transistor book designs wherein a row of p-type devices are placed within an Nwell region and a row of n-type devices are placed within an Pwell region.
Figure 2B:
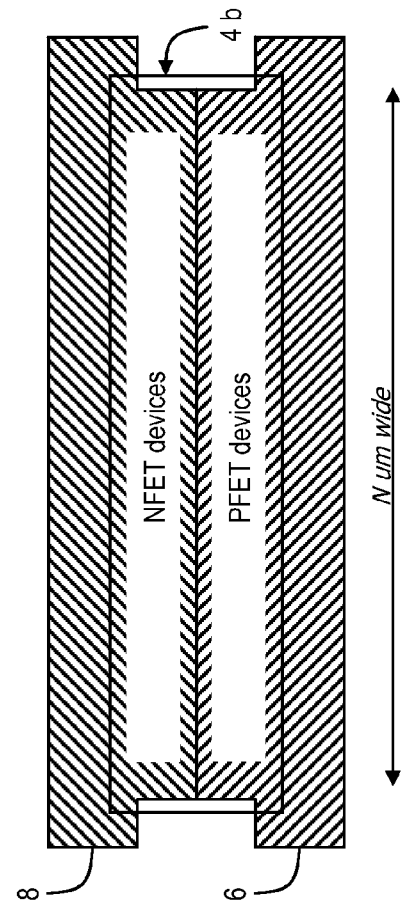
Figure 1:
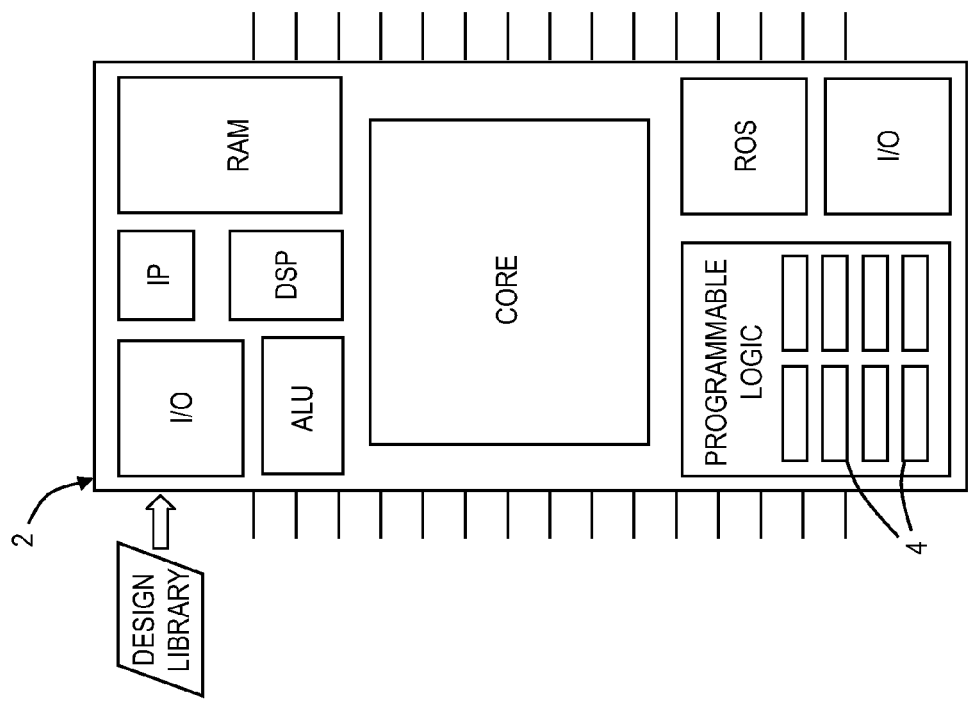
FIG. 1 is a high-level block diagram of a conventional application-specific integrated circuit (ASIC) which has various functional blocks and programmable logic that are derived from an ASIC design library.
Figure 3:
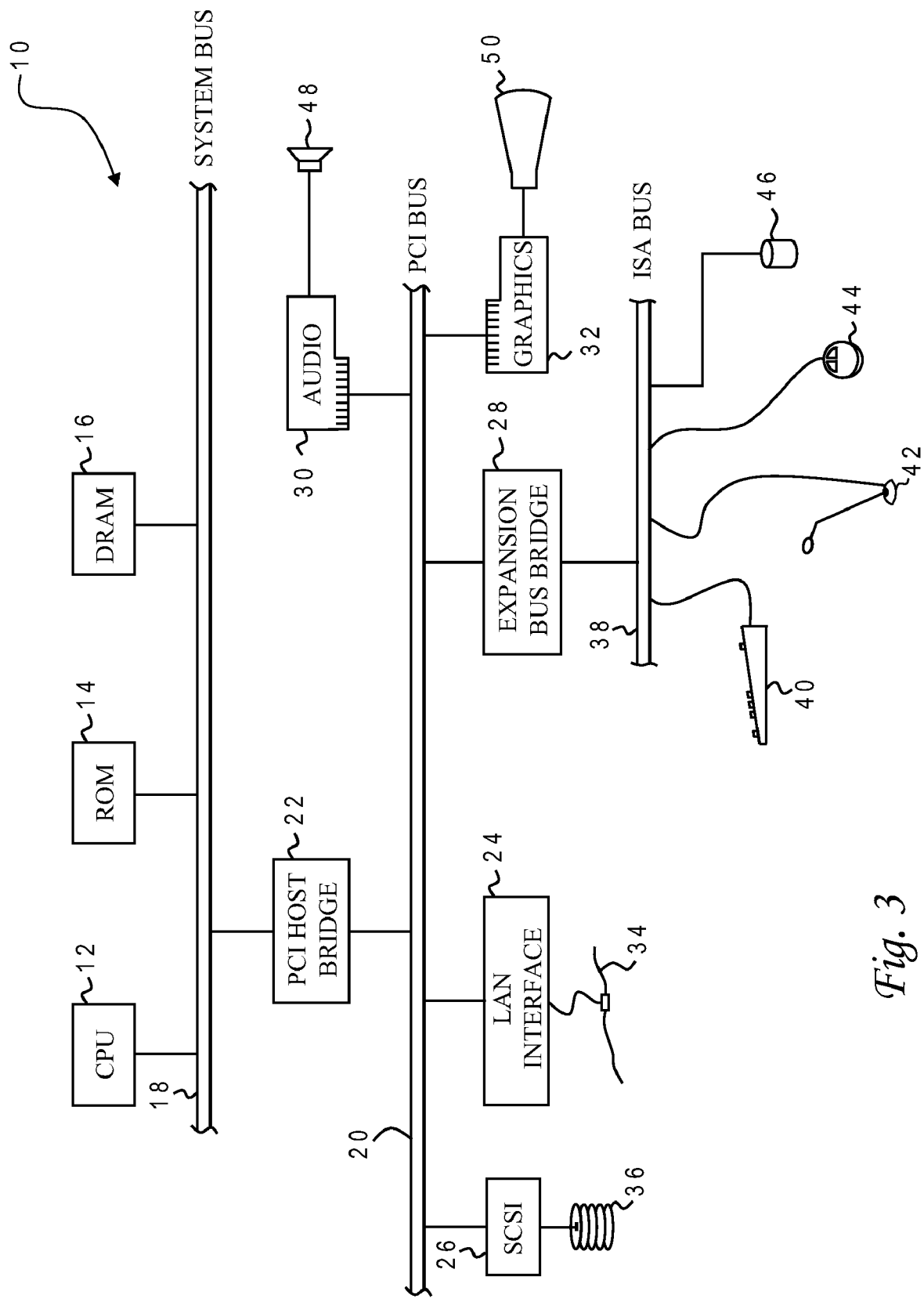
FIG. 3 is a block diagram of a computer system programmed to carry out computer-aided design of an integrated circuit in accordance with one implementation of the present invention.

With reference now to the figures, and in particular with reference to FIG. 3, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including a program which embodies the present invention as an application-specific integrated circuit (ASIC) design library, as well as any resultant data (circuit layouts) to be stored for later processing. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the ASIC design library embodying the present invention on disk drive 36, those skilled in the art will appreciate that the invention can be embodied in a program product utilizing other computer-readable media.

Computer system 10 carries out program instructions for the design of a programmable device such as an ASIC using novel transistor book designs adapted for improved radiation tolerance as explained below. These transistor books are selectively placed in the ASIC layout along with other functional circuit blocks. Accordingly, a program embodying the invention may include conventional aspects of various EDA tools used in ASIC design, and these details will become apparent to those skilled in the art upon reference to this disclosure.

Figure 4A:
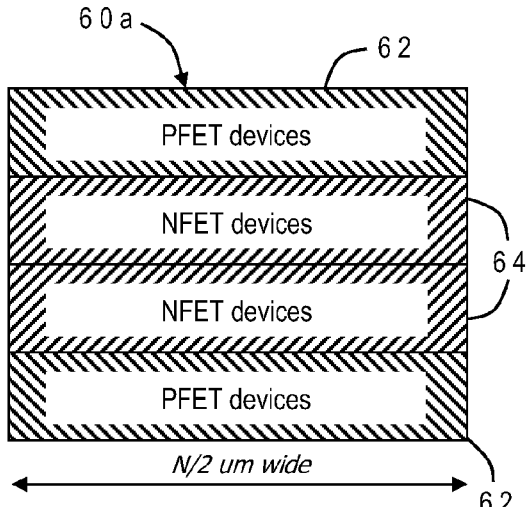
FIGS. 4A and 4B are plan views of two ASIC transistor book designs constructed in accordance with basic embodiments of the present invention.
Figure 4B:
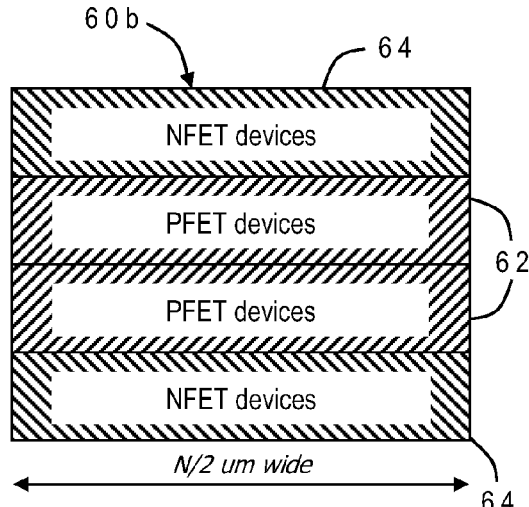

Referring now to FIGS. 4A and 4B, two basic embodiments are shown of a folded ASIC transistor book designed in accordance with the present invention. In FIG. 4A, transistor book 60a is comprised of four stacked, parallel rows of field-effect transistors (FETs), including two rows of p-type FETs (PFETs) and two rows of n-type FETs (NFETs). The PFETs are located within two separate, outer regions of complementary (n-type) doping 62 (Nwells), and the NFETs are located within two adjacent, inner regions of complementary (p-type) doping 64 (Pwells). The embodiment of book 60a is useful when two PFETs in the same book are desired for a circuit structure that the designer identifies as critical for radiation tolerance purposes. Since the PFETs in separate Nwells are physically isolated from each other, the circuit structure is much less likely to suffer multiple upsets from a single radiation strike. The intervening Pwells reduce charge migration after an ionizing radiation event.

An alternative embodiment is shown in FIG. 4B in which transistor book 60b has the transistor types and doping regions in opposite locations, i.e., there are still 2 rows of PFETs and 2 rows of NFETs but now the NFETs are in separate, outer Pwells 64 and the PFETs are in the adjacent, inner Nwells 62. The embodiment of book 60b is useful when two NFETs in the same book are desired for a circuit structure that is deemed critical for radiation tolerance purposes. The intervening Nwells similarly inhibit charge migration after an ionizing radiation event. If a designer is able to choose between using NFETs or PFETs for a particular circuit structure, then transistor book 60b is deemed preferable since NFETs are generally more sensitive to radiation.

Figure 6:
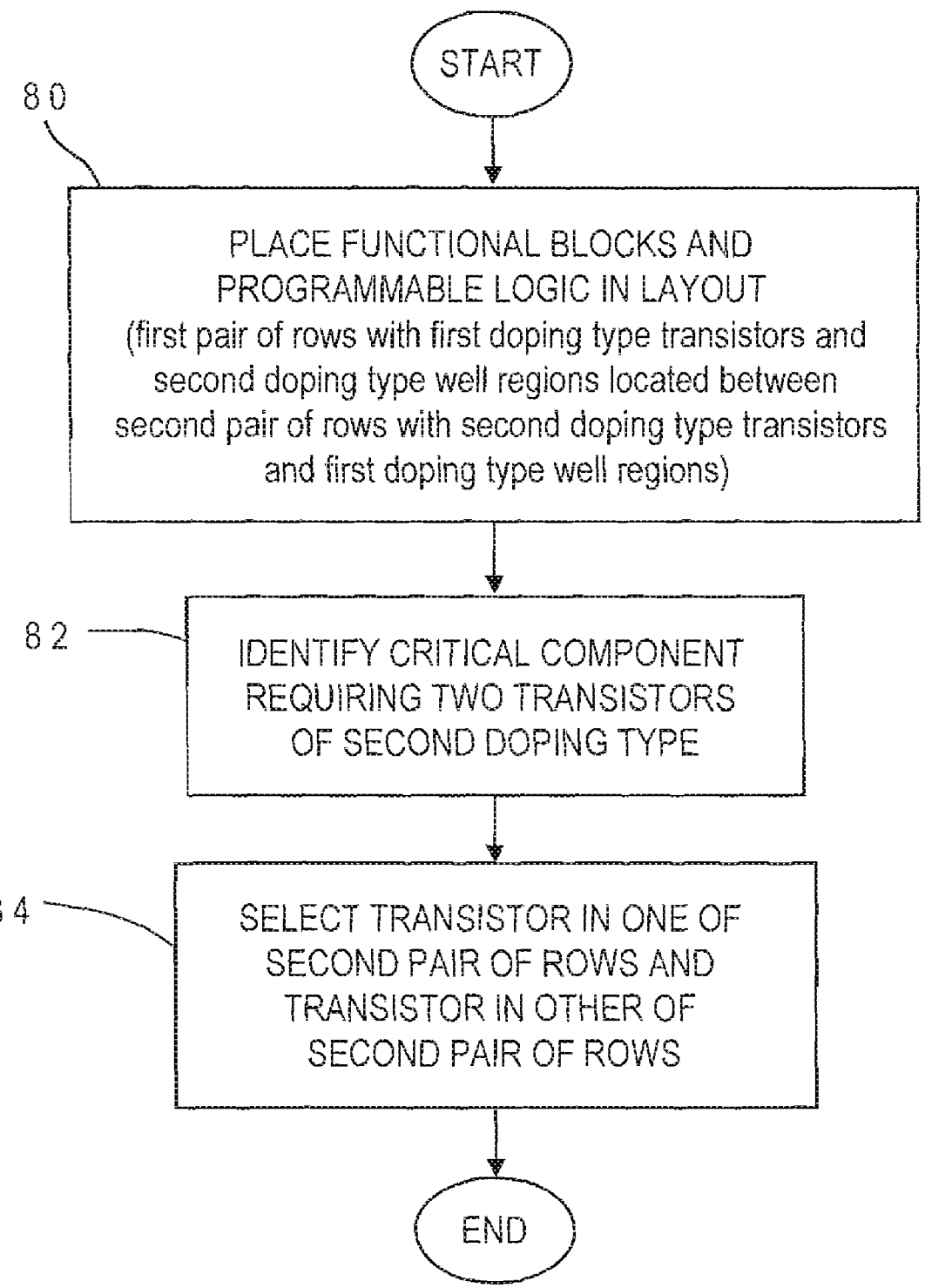
FIG. 6 is a chart illustrating the logical flow for placing a transistor logic book and selecting critical transistors in accordance with one implementation of the present invention.

With further reference to FIG. 6, templates for both of these books may be provided in a single ASIC design library. The functional blocks and programmable logic are placed in the layout according to the foregoing description (80). If a critical component is identified that requires at least two transistors of the same doping type in the same logic book (82), the designer can select the appropriate book having isolated rows of transistors of that doping type, i.e. one transistor from a first row and another transistor from a second row (84). While each of these embodiments has two inner, adjacent rows, those skilled in the art will appreciate that a single inner row will suffice to separate the outer well regions.

Transistor books 60a and 60b have the same area as a conventional, 2-row transistor book having the same number of like-sized transistors. In the example wherein the individual transistors have a width of about 1 µm, the overall width of book 60a or 60b is around N/2 µm where N is the total number of PFETs or NFETs in the book (e.g., 28). The doping level of the wells may vary according to the application; in the preferred embodiments they are heavily doped, i.e., P+ or N+.

Figure 5A:
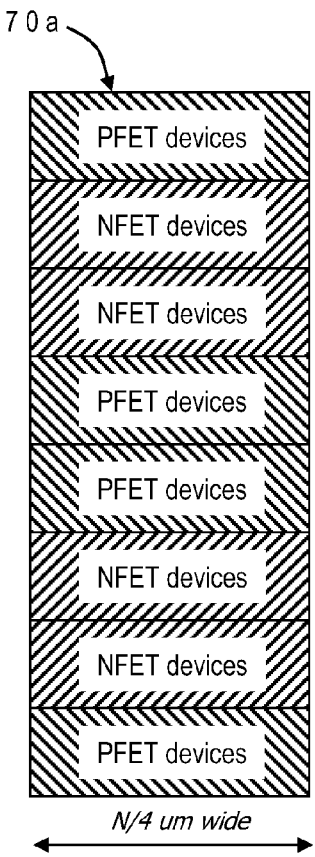
FIGS. 5A and 5B are plan views of two ASIC transistor book designs constructed in accordance with more complicated embodiments of the present invention.
Figure 5B:
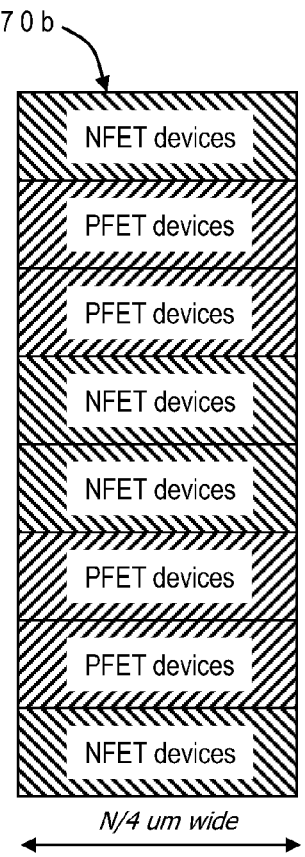

It may be desirable to use a single book for a critical circuit structure that has several NFET and PFET devices, and transistor books having further folding can be constructed based on the number of necessary devices as illustrated in FIGS. 5A and 5B. Transistor book 70a has four rows of PFET devices and four rows of NFET devices, with the PFET devices located in two outermost Nwell regions and two innermost Nwell regions, and NFET devices located in two adjacent pairs of interspersed Pwell regions. There are three separately isolated Nwells and two separately isolated Pwells in transistor book 70a. The complementary embodiment is shown in FIG. 5B wherein transistor book 70b again has four rows of PFET devices and four rows of NFET devices, but with the NFET devices located in two outermost Pwell regions and two innermost Pwell regions, and PFET devices located in two adjacent pairs of interspersed Nwell regions. There are three separately isolated Pwells and two separately isolated Nwells in transistor book 70b. An exemplary width of book 70a or 70b is around N/4 µm. An ASIC design library of the present invention may accordingly include templates for a variety of books having different orders of folding. The designer then has greater flexibility in selecting devices in isolated wells for critical components of any complexity.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been disclosed in the context of a transistor book, it is applicable to other book components which may share an Nwell or Pwell, such as diodes. It is therefore contemplated that such modifications can be made without departing from the spirit or scope of the present invention as defined in the appended claims.

What is claimed is:

1. An application-specific integrated circuit comprising:
a substrate;
a plurality of functional circuit blocks formed on said substrate; and
programmable logic formed on said substrate which includes one or more transistor books having at least a first pair of rows of first transistors with a first doping type located in first wells having a second doping type and at least a second pair of rows of second transistors with the second doping type located in second wells, wherein said first pair of rows is contiguous and is located between said second pair of rows, and said programmable logic further includes at least one circuit component for which radiation tolerance is desired, said circuit component using at least one of said second transistors in a first one of said second pair of rows and another one of said second transistors in a second one of said second pair of rows.

2. The application-specific integrated circuit of claim 1 wherein:
said first transistors are n-type field-effect transistors;
said first wells are Pwells;
said second transistors are p-type field-effect transistors; and
said second wells are Nwells.

3. The application-specific integrated circuit of claim 2 further comprising at least a third pair of rows of n-type field-effect transistors, wherein:
said first pair of rows are innermost rows;
said second pair of rows are interspersed rows; and
said third pair of rows are outermost rows.

4. The application-specific integrated circuit of claim 1 wherein:
said first transistors are p-type field-effect transistors;
said first wells are Nwells;
said second transistors are n-type field-effect transistors; and
said second wells are Pwells.

5. The application-specific integrated circuit of claim 4 further comprising at least a third pair of rows of p-type field-effect transistors, wherein:
said first pair of rows are innermost rows;
said second pair of rows are interspersed rows; and
said third pair of rows are outermost rows.

6. A computer-implemented method of designing an application-specific integrated circuit, comprising:
placing a plurality of functional blocks and programmable logic in a layout by executing first program instructions in a computer system, the programmable logic including one or more transistor books having at least a first pair of rows of first transistors with a first doping type located in first well regions having a second doping type and at least a second pair of rows of second transistors with the second doping type located in second well regions having the first doping type, wherein the first pair of rows is contiguous and is located between the second pair of rows;
identifying a component of the application-specific integrated circuit for which radiation tolerance is desired and which requires at least two transistors of the second doping type by executing second program instructions in the computer system responsive to designer selection; and
selecting for the required transistors a first one of the second transistors in a first one of the second pair of rows and a second one of the second transistors in a second one of the second pair of rows which is isolated from the first one of the second pair of rows by executing third program instructions in the computer system.

7. The method of claim 6 wherein: the first transistors are n-type field-effect transistors; the first well regions are Pwells; the second transistors are p-type field-effect transistors; and the second well regions are Nwells.

8. The method of claim 7 wherein the transistor book further comprises at least a third pair of rows of n-type field-effect transistors, the first pair of rows being innermost rows, the second pair of rows being interspersed rows, and the third pair of rows being outermost rows.

9. The method of claim 6 wherein:
the first transistors are p-type field-effect transistors;
the first well regions are Nwells;
the second transistors are n-type field-effect transistors; and
the second well regions are Pwells.

10. The method of claim 9 wherein the transistor book further comprises at least a third pair of rows of p-type field-effect transistors, the first pair of rows being innermost rows, the second pair of rows being interspersed rows, and the third pair of rows being outermost rows.

* * * * *